US009070524B2

(12) United States Patent
Steeneken et al.

(10) Patent No.: US 9,070,524 B2
(45) Date of Patent: Jun. 30, 2015

(54) RF MEMS SWITCH WITH A GRATING AS MIDDLE ELECTRODE

(75) Inventors: Peter Gerard Steeneken, Valkenswaard (NL); Hilco Suy, Eindhoven (NL); Rodolf Herfst, Waalke (NL); Twan Van Lippen, Bladel (NL)

(73) Assignee: NXP, B.V., Eindhoven (NL)

( * ) Notice: Subject to any disclaimer, the term of this patent is extended or adjusted under 35 U.S.C. 154(b) by 803 days.

(21) Appl. No.: 13/319,034

(22) PCT Filed: May 7, 2010

(86) PCT No.: PCT/IB2010/052010
§ 371 (c)(1),
(2), (4) Date: Nov. 11, 2011

(87) PCT Pub. No.: WO2010/128482
PCT Pub. Date: Nov. 11, 2010

(65) Prior Publication Data

US 2012/0048709 A1 Mar. 1, 2012

(30) Foreign Application Priority Data

May 8, 2009 (EP) .................................... 09159785

(51) Int. Cl.
*H01G 5/16* (2006.01)
*H03K 17/975* (2006.01)
*H01H 59/00* (2006.01)

(52) U.S. Cl.
CPC ... *H01H 59/0009* (2013.01); *H01H 2059/0018* (2013.01)

(58) Field of Classification Search
CPC ................................ H01G 5/011; H01G 5/16
USPC ......... 361/271–330, 500–541, 763, 766, 734, 361/738, 782, 821, 830; 29/25.41–25.42; 252/500, 570; 200/50.21–50.27, 600
See application file for complete search history.

(56) References Cited

U.S. PATENT DOCUMENTS 5,665,997 A 9/1997 Weaver et al.
6,803,534 B1 10/2004 Chen et al.

(Continued)

FOREIGN PATENT DOCUMENTS

CN 101043030 A 9/2007
GB 2 110 901 A 6/1983

(Continued)

OTHER PUBLICATIONS

Luo, J. K. et al. "MEMS based Digital Variable Capacitors with a High-*k* Dielectric Insulator", Sensors and Actuators A: Physical, vol. 132, No. 1, pp. 139-146 (2006).

(Continued)

*Primary Examiner* — Eric Thomas

(57) ABSTRACT

The present invention provides a capacitive MEMS device comprising a first electrode lying in a plane, and a second electrode suspended above the first electrode and movable with respect to the first electrode. The first electrode functions as an actuation electrode. A gap is present between the first electrode and the second electrode. A third electrode is placed intermediate the first and second electrode with the gap between the third electrode and the second electrode. The third electrode has one or a plurality of holes therein, preferably in an orderly or irregular array. An aspect of the present invention integration of a conductive, e.g. metallic grating as a middle (or third) electrode. An advantage of the present invention is that it can reduce at least one problem of the prior art. This advantage allows an independent control over the pull-in and release voltage of a switch.

15 Claims, 5 Drawing Sheets

(56) References Cited

U.S. PATENT DOCUMENTS

| | | | | |
|---|---|---|---|---|
| 7,102,472 | B1 * | 9/2006 | Nathanson et al. | 335/78 |
| 7,137,300 | B2 * | 11/2006 | Aoyagi et al. | 73/514.32 |
| 7,345,866 | B1 * | 3/2008 | Hsu et al. | 361/277 |
| 7,385,800 | B2 * | 6/2008 | Morris et al. | 361/277 |
| 7,440,254 | B2 * | 10/2008 | Gallant | 361/277 |
| 7,751,173 | B2 | 7/2010 | Ikehashi et al. | |
| 2006/0012940 | A1 | 1/2006 | Song et al. | |
| 2009/0201623 | A1 | 8/2009 | Steeneken | |

FOREIGN PATENT DOCUMENTS

| | | | | |
|---|---|---|---|---|
| WO | WO 2006117709 | A2 * | 11/2006 | |
| WO | WO 2007072407 | A2 * | 6/2007 | |

OTHER PUBLICATIONS

International Search Report for Patent Application No. PCT/IB2010/052010 (Jul. 22, 2010).

* cited by examiner

RF MEMS SWITCH WITH A GRATING AS MIDDLE ELECTRODE

FIELD OF THE INVENTION

The present invention relates to miniature switching devices such as capacitive MEMS switches and methods of making the same. The present invention in particular relates to miniature RF switching devices such as capacitive MEMS switches and methods of making the same.

TECHNICAL BACKGROUND

MEMS (Microelectromechanical Systems) are electromechanical and microelectronics components in a single device. For example, RF MEMS switches can combine the advantages of traditional electromechanical switches (low insertion loss, high isolation, extremely high linearity) with those of solid-state switches (low power consumption, low mass, long lifetime). RF-MEMS switches furthermore have the advantage of having the possibility for low-cost integration on a variety of substrates, including substrates bearing active semiconductor devices.

One type of RF MEMS device is an adjustable capacitor constructed from two conductive plates—one on the surface of a substrate and the other suspended a short distance above it. Capacitive RF MEMS switches suffer from two main reliability problems. One of these is charge injection in the dielectric as a result of high electric fields. The second problem is degradation or deformation of the membrane or springs of the switch as a result of high speed impact.

SUMMARY OF THE INVENTION

It is an object of the present invention to provide a MEMS device and a method for the manufacturing of such a MEMS device. This objective is accomplished by a method and device according to the present invention.

The present invention provides a capacitive MEMS device comprising a first electrode lying in a plane, and a second electrode suspended above the first electrode and movable with respect to the first electrode. The thickness of the first electrode can be 0.1 μm, e.g. in the range 0.01-0.5 μm. The thickness of the second electrode may be 5 μm, e.g. in the range: 0.3-8 μm. The first electrode functions as an actuation electrode. A gap is present between the first electrode and the second electrode. A third electrode is placed intermediate the first and second electrode with the gap between the third electrode and the second electrode. The size of the gap can be 3 μm, e.g. in the range: 0.1-5 μm. The thickness of the third electrode can be 0.5 μm, e.g. in the range 0.1-5 μm.

The third electrode has one or a plurality of holes therein, preferably in an orderly or irregular array. An aspect of the present invention is integration of a conductive, e.g. metallic grating as a middle (or third) electrode. An advantage of the present invention is that it can reduce at least one problem of the prior art. This advantage allows an independent control over the pull-in and release voltage of a switch.

According to embodiments of the invention, the third electrode may be buried between a first dielectric layer and a second dielectric layer, thus forming a stack. The first dielectric layer is located between the first electrode and the third electrode, and the third electrode is covered by a second dielectric layer facing the bottom of the second electrode. The thickness of the first and second dielectric layers can be 200 nm, e.g. in the range 10 nm-1 μm.

In use a DC potential may be applied to the first electrode such as a ground potential. In use a DC potential may be applied to the second electrode. In use a signal, e.g. an RF voltage may be applied to the second electrode and an output signal, e.g. an RF output signal may be taken from the third electrode, or an RF voltage may be applied to the third electrode and an output signal, e.g. an RF output signal may be taken from the first electrode.

In some embodiments the second electrode has one or a plurality of holes therein, e.g. in an orderly or irregular array. An aspect of the present invention integration of a conductive, e.g. metallic grating as a top (or second) electrode. In some embodiments the first electrode has one or a plurality of holes therein, preferably in an orderly or irregular array. An aspect of the present invention integration of a conductive, e.g. metallic grating as a bottom (or first) electrode.

The first electrode may have a first area, the second electrode may have a second area and the third electrode may have a third area, the first, second and third area extending in a direction substantially parallel to the plane of the first electrode. In embodiments according to the present invention, the first, second and third area may be substantially the same. In that case, a direct electrostatic force may be present over the full capacitor area.

Accordingly, a device in accordance with embodiments of the present invention has three layers to provide improved reliability. A switch according to embodiments of the present invention makes use of a conductive, e.g. metallic grating as middle electrode.

Switches according to embodiments of the present invention have at least one of the following advantages over the prior art:

1. Less sensitive to charging.
2. Less sensitive to permanent deformation of the structural elements.
3. A smaller ratio $V_{pi}/V_{re}$ is possible, e.g. a reduction of the range by a factor 1 to 100.
4. For $A_{act}>A_{RF}$ the device will be less sensitive to RF pull-in.
5. The capacitance ratio's $C_{on}/C_{of}$ can be 20, e.g. in the range 5-500.
6. The switching speed can be in the range 5-50 μs.
7. The operation frequency range can be, for example, 0.1-100 GHz.

Particular and preferred aspects of the invention are set out in the accompanying independent and dependent claims. Features from the dependent claims may be combined with features of the independent claims and with features of other dependent claims as appropriate and not merely as explicitly set out in the claims.

DETAILED DESCRIPTION OF THE DRAWINGS

Figure 1:
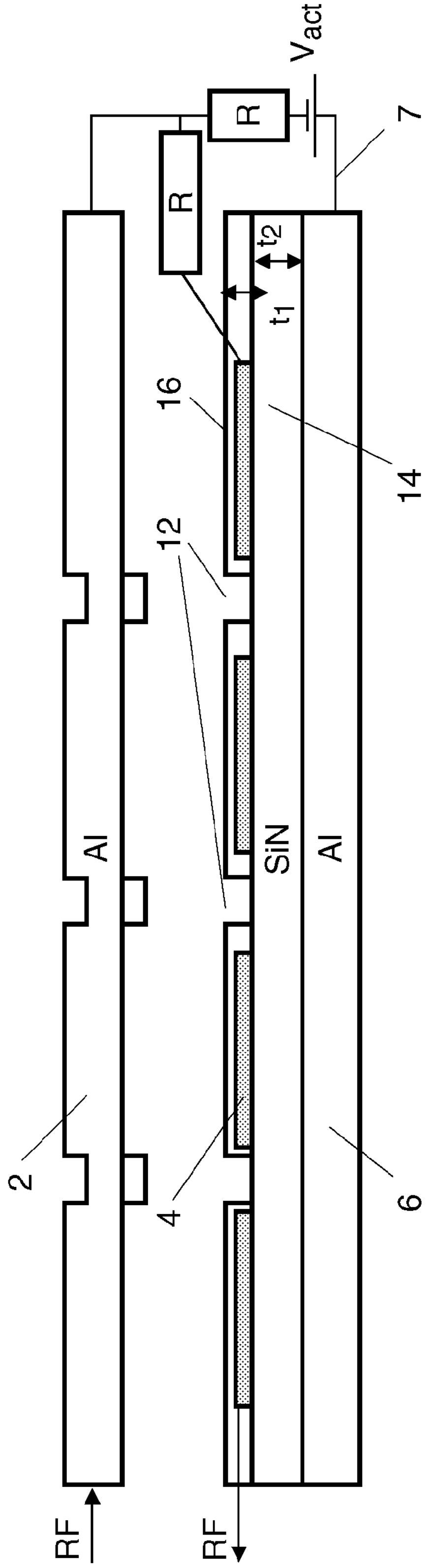
FIG. 1 shows a cross-section of a switching device according to an embodiment of the present invention.

In the following detailed description of the preferred embodiments, reference is made to the accompanying drawings, which form a part hereof, and within which are shown by way of illustration specific embodiments by which the invention may be practised. In the different Figures, the same reference signs refer to the same or analogous elements. The drawings described are only schematic and are non-limiting. In the drawings, the size of some of the elements may be exaggerated and not drawn on scale for illustrative purposes. Those skilled in the art will recognise that other embodiments may be utilised and structural changes may be made without departing from the scope of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

In embodiments of the present invention, the term "substrate" may include any underlying material or materials that may be used, or upon which a device, a circuit or an epitaxial layer may be formed. In other alternative embodiments, this "substrate" may include a semiconductor substrate 1 such as e.g. doped silicon, high-ohmic silicon, glass, aluminium oxide ($Al_2O_3$), a gallium arsenide (GaAs), a gallium arsenide phosphate (GaAsP), a germanium (Ge) or a silicon germanium (SiGe) substrate. The "substrate" may include, for example, an insulating layer such as a $SiO_2$ or a $Si_3N_4$ layer in addition to a semiconductor substrate portion. Thus, the term "substrate" also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer. The following processing steps are mainly described with reference to silicon processing but the skilled person will appreciate that the present invention may be implemented based on other semiconductor material systems and that the skilled person can select suitable materials as equivalence of the dielectric and conductive materials described below.

There are various ways that MEMS devices can be made. One way is to make use of standard semiconductor processing techniques, such as layer deposition, CVD, sputtering, etching, patterning using a lithographic techniques such as photoresist patterning and etching or using lift-off techniques, implantation or doping, ion beam milling or isotropic or anisotropic etching, polishing, etc. The devices produced are dimensionally very accurate and the materials can have high levels of, or highly controlled levels of, purity. Other methods are available such as techniques developed to produce Large Area Electronics. Still other methods are available such as the deposition of layers by processes such as spin coating, e.g. of polymeric materials, CVD, sputtering, polishing, patterning by silk-screen printing, hick film techniques, etc. The present invention is not limited to any particular method but will be described in the context of semiconductor processing for example only.

A cross-section of a device in accordance with an embodiment of the present invention is shown schematically in FIG. 1. The device comprises various layers on, in or fixed to a substrate, e.g. a top electrode 2, a middle electrode 4 and a bottom electrode 6. The bottom electrode 6 may be supported on the substrate. The electrodes 2, 4, 6 are made of conductive material of which a metal is a preferred example, e.g. aluminium or aluminium copper alloy or gold. The top, middle and bottom electrodes 2, 4, 6 can be formed from the same metal or from different metals. It is most preferred that the RF electrodes 2 and 4 have a high conductivity, so they are preferentially made thick and of a high conductivity metal. Electrode 6 only needs to carry a low frequency or DC voltage, therefore it can have a higher resistivity and sheet resistance. If this resistance is high enough, one or more of the resistors R in FIG. 1 can be omitted, since their function is taken by the resistance of the electrode 6. The thickness of the top electrode 2 may be 5 μm, e.g. in the range: 0.3-8 μm. The thickness of the middle electrode 4 can be 0.5 μm, e.g. in the range 0.1-5 μm. The thickness of the bottom electrode 6 can be 0.1 μm, e.g. in the range 0.01-0.5 μm.

A gap is present between between the middle electrode 4 and the top electrode 2. The size of the gap can be 3 μm, e.g. in the range: 0.1-5 μm. The top electrode 2 is movable and is adapted to receive an electronic signal such as an RF signal. The RF signal flows from the top to the middle electrodes 2, 4 (or vice versa). The top and middle electrodes 2, 4 form a first capacitor. The middle electrode 4 preferably has first holes 12 therein, e.g. the first holes may be arranged in an irregular or regular array and the middle electrode 4 may be in the form of a conductive, e.g. metallic, grating or grid. The percentage of area covered by holes is preferably between 30% and 90%. In fact for a good operation of the holes, the diameter of the holes should preferably be large compared to the sum of the thicknesses of upper and lower dielectric layers 16, 14 and the gap (t1+t2+g see below for further explanation of the dielectric layers). Secondly, the distance between the edges of the holes are preferably small (<20%) compared to the size of the total area of electrode 2. So as an example for a switch of 400×400 $\mu m^2$ with t1+t2+g=2 μm a typical hole diameter is 20 μm with distance between the holes of 20 micron. The holes 12 may be any suitable shape such as polygonal, elliptical, oval, rectangular, triangular, etc. Alternatively, the remaining material in the electrode which may be described as islands may be any suitable shape such as polygonal, elliptical, oval, rectangular, triangular, etc. (e.g. a preferred shape of the holes is circular).

The bottom electrode 6 is adapted to receive an actuation voltage, e.g. from a voltage source via an activation line 7 to which it is connected. The activation voltage draws the top electrode towards the bottom electrode and changes the capacitance of the device. The top and middle electrodes 2, 4 are preferably kept at a DC potential, i.e. the bottom electrode 6 is coupled to a DC ground potential and the top and middle electrodes are coupled to a DC potential (e.g. via resistors R). Two dielectric layers 14, 16 are located one each below and above the middle electrode, respectively, i.e. an upper (16) and a lower (14) dielectric layer. The upper and lower dielectric layers 16, 14 have thicknesses $t_2$ and $t_1$ above and below the middle electrode 4, respectively.

For a high capacitance density it is preferred to have the thickness of t2 as small as possible, for a good reliability and breakdown voltage it is better to have it thicker. Thickness of t2=10-500 nm. Typical thickness of t1=2-10 times so 20 nm-5 micron. In FIG. 1 the distance between the bottom of the top electrode and the top of the dielectric above the middle electrode is constant.

The upper and lower dielectric layers 16, 14 may be made of any suitable dielectric material especially one that can be deposited with other layers of the device, e.g. can be processed in accordance with standard semiconductor processing. They may be made of the same or different materials. For example the dielectric material can be silicon nitride. In the open state of the switch, a gap separates the top electrode 2 and the top of the upper dielectric 16. The top electrode 2 is free to move to close the gap. The top electrode 2 is free to move under a counteracting (resisting) elastic force provide by a resilient device such as a spring. This gap may be an air gap when the switch is operated in air, or the gap may be filled with other gasses such as nitrogen or the device may be operated under vacuum to reduce air viscous damping/frictional/drag effects which can slow operation. Impedances such as resistors R block the RF signal to flow through the actuation lines 7 to the bottom electrode 6 (or vice versa). The RF signal will therefore flow through the first capacitor from the top to the middle electrodes 2, 4.

Figure 2A:
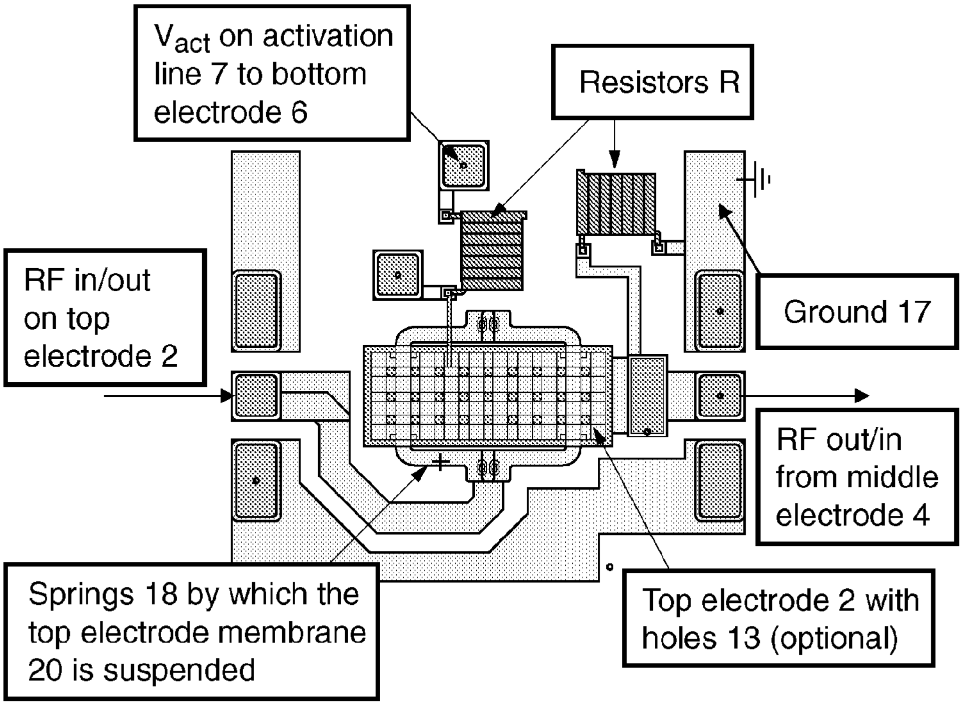
FIG. 2 shows a top view of a capacitive MEMS switch with metallic grating in the middle electrode according to an embodiment of the present invention. The top picture shows all metal layers of the device. In the bottom picture the top metal layer is removed which makes the metallic grating better visible.

A mask design of this device is shown in FIGS. 2*a* and *b*. As seen from FIG. 2*a*, it is noted that in the top electrode 2, second holes 13 can be present optionally, these second holes 13 being useful for manufacturing the device and also to reduce gas damping which limits the switching speed. The area of the holes in the top electrode should preferably be less than 5%. The holes 13 may be any suitable shape such as polygonal, elliptical, oval, rectangular, triangular, etc. Alternatively, the remaining material in the electrode which may be described as islands may be any suitable shape such as polygonal, elliptical, oval, rectangular, triangular, etc. These second holes 13 are not essential for the invention. The conductive, e.g. metallic, grating or grid of the middle electrode 4 is completely covered by the top electrode 2. That is, the top electrode 2 is preferably co-terminous with the middle electrode 4 or is bigger than the middle electrode 4. The size of the first and/or second holes 12, 13 in the respective grid can be tuned by design. There is a trade-off: the larger the first holes 12, the lower the pull-in voltage and release voltage, but also the lower the capacitance of the switch in the closed state. The first hole density should be sufficiently large to ensure an intimate contact between top electrode 2 and the upper dielectric 14.

The upper electrode 2 is kept in the gap-open position by means of a resilient device such as spring or springs 18. The spring or springs 18 may be integral with the top electrode or may be made of a different material. The upper electrode 2 may be formed as a membrane 20. The bottom, middle, and top electrode, the spring or springs, the contact pads etc. can all be made by conventional processing technology, e.g. of applying a sequence or layers and patterning the layers as required, e.g. using a photoresist, etching steps and optional polishing steps The top electrode 2 may be freed from the underlying layers by deposition and later removal of a sacrificial layer located between the top dielectric layer 16 and the bottom of the top electrode 2 or the bottom surface of the top electrode membrane 20. The sacrificial layer is removed by any suitable process, e.g. selective etching or melting, in order to free the top electrode 2.

As seen from FIG. 2*a* the bottom electrode 6 is connected to the source of activation voltage through activation line 7.

Figure 2B:
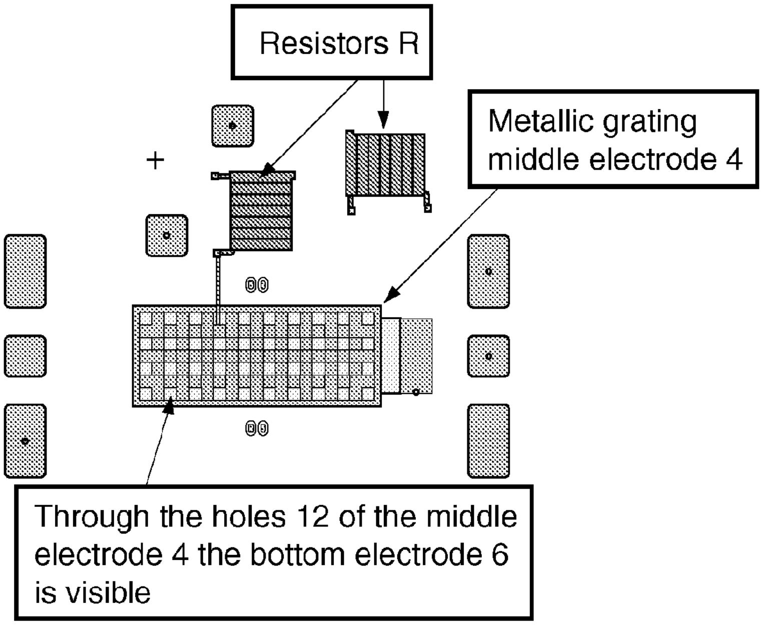

As seen from FIG. 2*b*, the bottom electrode 6 is substantially the same size as the middle and upper electrode, 4, 2.

The operational principle of the switch is as follows. An advantage of the switch according to the present invention is that the dielectric thickness used for actuating the switch (thickness $t_1+t_2$) can be controlled independently from the thickness of the dielectric that determines the RF capacitance of the switch (thickness $t_2$).

For a conventional capacitive MEMS switch, with a large capacitance switching ratio, the ratio between the pull in voltage $V_{pun\text{-}in}$ and the release voltage $V_{release}$ is fixed for a given gap size and dielectric thickness. This is indicated by the following equation (1) which can be derived for a conventional capacitive MEMS switch with a large tuning ratio $\alpha=C_{close}/C_{open}$:

$$\frac{V_{pi}}{V_{re}} \approx \sqrt{\frac{4}{27}\frac{C_{close}}{C_{open}}} \tag{1}$$

If the switching ratio $\alpha$ is not much larger than 1, equation (1) becomes: $V_{pi}/V_{re}=\alpha(8/27*\alpha/(20\alpha-2))^{1/2}$.

The performance of the switch is optimal if switching ratio is maximal. However a large ratio between $V_{pi}$ and $V_{release}$ is often not to be preferred. A large value of $V_{pi}$ requires high voltages to actuate the switch and also results in large electric fields across the dielectric. A small value of $V_{re}$ makes the switch very sensitive to stiction as a result of charging or other adhesive forces.

In order to explain the operation of a switch according to this embodiment of the present invention, fringing fields are neglected. This is only truly valid if the layer and gap thickness is much smaller than the hole size in the middle electrode. In that case a part with area $A_{act}$ of the bottom surface of the top electrode will face the bottom electrode, and a part with area $A_{RF}$ will face the middle electrode. The capacitance is given by $C=A\epsilon_0/(g+t/\epsilon_r)$ where t is the dielectric thickness, $\epsilon_r$ the relative dielectric constant, g the gap and A the area of the switch. This gives the following relation for a switch according to this embodiment (assuming both dielectric layers have the same dielectric constant):

$$\frac{V_{pi}}{V_{re}} \approx \sqrt{\frac{4}{27}\frac{C_{close,act}}{C_{open,act}}} \approx \sqrt{\frac{4}{27}\frac{g\varepsilon_r}{t_1+t_2}} \tag{2}$$

$$\frac{C_{close,RF}}{C_{open,RF}} \approx \frac{g\varepsilon_r}{t_2} \tag{3}$$

The present embodiment has at least one of the following advantages:

1. Smaller ratio $V_{pi}/V_{re}$

From equations (2) and (3) it can be seen that the ratio of $V_{pi}/V_{re}$ can be smaller for the proposed switch by a factor $t_2/(t_1+t_2)$ than for a conventional switch with the same capacitance switching ratio. In a modification of this embodiment, the switch is formed such that $(t1+t2)/\epsilon_r>2g/3$, and then $V_{pi}=V_{re}$ and the capacitance of the switch is continuously tunable. This is a significant improvement compared to the state of the art, because the state of the art has as a drawback that continuously tuned devices have a very small capacitance density if $(t1)/\epsilon_r>2g/3$, since their capacitance density is determined by t1 and in for the present invention this is determined by t2. By making t2 thin and t1 thick it is possible to make a continuously tunable device with a factor of t1/t2 higher capacitance density.

2. There is a smaller electric field across the dielectric and thus less charging.

a. If $V_{re}$ is kept the same as for a conventional switch, $V_{pi}$ will be lower by a factor $t_2/(t_1+t_2)$ than for a conventional switch with the same RF capacitance switching ratio. At the same time the thickness of the dielectric across which the actuation voltage is applied has increased by a factor $(t_1+t_2)/t_2$ Assuming that the switch is kept in the closed state at a voltage $V_{pi}$, the electric field is proportional to V/t and thus decreases by a factor $(t_2/t_1+t_2))^2$. Since charging is an exponential function of voltage this can result in a large reduction of the charging speed.

b. If $V_{pi}$ is kept the same as a conventional switch the electric field will reduce by a factor $(t_2/(t_1+t_2))$. At the same time $V_{re}$ will increase by a factor $(t_1+t_2)/t_2$. This increase will also reduce failure due to charging since it will take a longer time before the amount of charge results in a shift or narrowing of the C-V curve which is larger than $V_{re}$.

3. Less electrostatic force in the closed position and therefore the switch is less sensitive to static and dynamic spring deformation.

a. A possible failure mode of RF MEMS switches is that the electrostatic forces are so large that the stresses in the moving structure exceed the yield stress. This can result in permanent plastic deformation of the device and can thus result in failure of the device. Since the electrostatic force in the closed position is proportional to $1/t^2$, the proposed switch will exert a pressure which is a factor $(t_2/(t_1+t_2))^2$ smaller than the conventional switch (at the same voltage). This can strongly reduce the likelihood of spring and membrane deformation. This is reduction is especially effective if the actuation (bottom) electrode is situated below the springs of the structure. If this not the case the contact force will largely cancel the increased electrostatic pressure.

b. For the same argument as above, the total kinetic energy picked up by the switch during it closing motion will be less. Therefore deformations as a result of high speed impact of the switch on the dielectric will be reduced.

4. If $A_{act}>A_{RF}$ the device will be less sensitive to undesired pull-in as a result of a large amplitude RF voltage across the RF terminals than a conventional device. In other words if $A_{act}>A_{RF}$ then $V_{PLRF}>V_{PLDC}$. On the other hand if $A_{act}<A_{RF}$ then $V_{PLRF}<V_{PLDC}$ and it will be more sensitive.

The grid middle electrode 4 reduces the effective area of the RF electrode 2 and the actuation (bottom) electrode 6. It should be noted that the smaller RF capacitance can be compensated by a smaller thickness $t_2$ and the increased $V_{pi}$ can be compensated by a smaller spring constant. After these compensations the device with the same capacitance and area as a conventional MEMS switch will still offer improved reliability.

Such a device according to this embodiment may have a slightly larger RF resistance and self-inductance. It should also be noted that if the hole size becomes of the order of the gap size fringing fields will start to play a significant role and might decrease the effectiveness of the device. The hole density should on the other hand be sufficiently large to ensure an intimate contact between top electrode and dielectric. The area covered by holes is preferably 30-90% of the total area.

In a further embodiment of the present invention the bottom electrode 6 is also formed as a grating, i.e. has third holes 15 that can be arranged in an irregular or regular array. The amount of holes can be approximately equal to 100% minus the percentage of holes in the middle electrode. So preferably the amount of holes in the bottom electrode is 100−(30-90)=10−70%. The middle and bottom electrodes 4, 6 preferably have a minimal overlap. The effect is to prevent charge leaking through the dielectric between the middle and bottom electrodes 4, 6. Such a device is shown schematically in FIG. 3. If field fringing is taken into account, the optimal hole shape of the holes 12 in the middle electrode 4 is circular. The holes 12 however may be any suitable shape such as polygonal, elliptical, oval, rectangular, triangular, etc. Alternatively, the remaining material in the electrode which may be described as islands may be any suitable shape such as polygonal, elliptical, oval, rectangular, triangular, etc.

Figure 3:
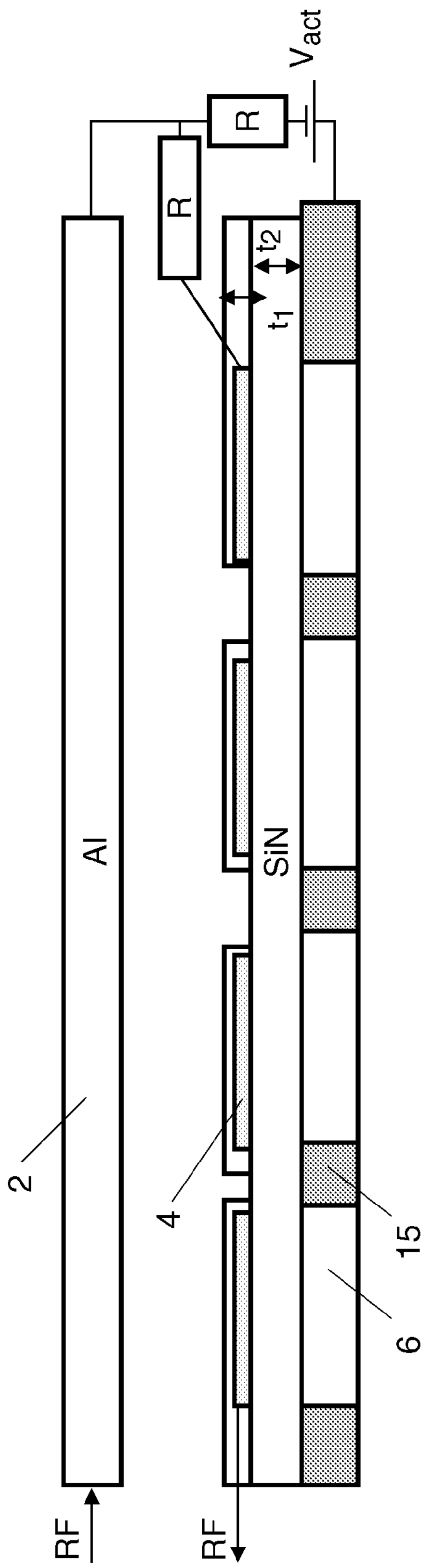
FIG. 3 shows a further embodiment of the present invention that minimizes overlap between the grating of the middle electrode and that of the bottom electrode.
Figure 5:
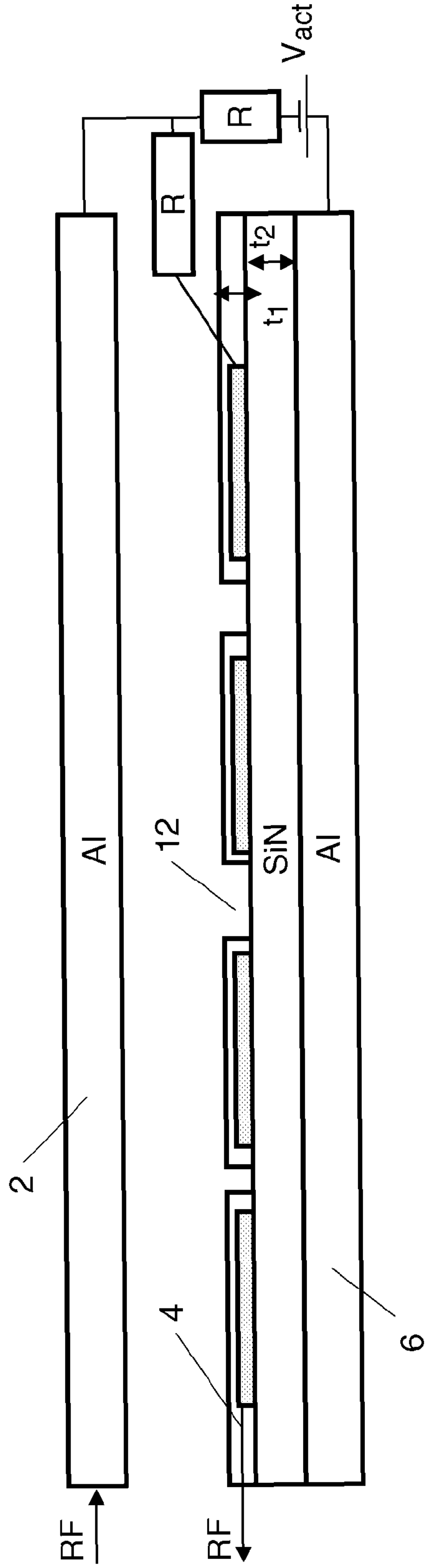
FIG. 5 shows a device according to another embodiment with a planarized top of the sacrificial layer.

An arrangement of the first and/or second holes 12 and/or 13 and/or third holes 15 according to a preferred embodiment is hexagonal (i.e. the lines connecting the centers of the holes should make angles of 60 degrees with respect to each other). In combination with the implementation of FIG. 3 a preferred shape of the bottom electrode 6 is a network of circular islands just below the holes of the middle electrode. The islands should be connected with as thin as possible lines. FIG. 3 shows a device according to another embodiment with a planarized top of the sacrificial layer. It should be noted that the structure in FIG. 1 can be created by removing a sacrificial layer between the top electrode 2 and the top of the dielectric layer 14. Since the dielectric layer 14 has a uniform thickness (only shown schematically in FIGS. 1 and 3), height differences will occur both on the top of the dielectric layer 14 and on the bottom surface of the top electrode 2. In an improved implementation the top of the sacrificial layer is to have this planarized (e.g. by a polishing step such as CMP or SOG). This will retain the height differences of the top of the dielectric layer 16, but will remove the height differences on the bottom surface of the top electrode 2 (shown in FIG. 5). In this embodiment, the size of the air gap from second electrode 2 to the second dielectric is not constant (in contrast to FIG. 1 where it is constant). When the top electrode lands on the dielectric, the remaining air gaps diminish the electric field inside the bottom dielectric $t_1$. In this case the effective actuation thickness $t_{eff}$ will increase by the middle electrode thickness $t_{middle}$ ($t_{eff}$ goes from $(t_1+t_2)/\epsilon_r$ to $(t_1+t_2)/\epsilon_r+t_{middle}$). FIG. 5.

Figure 4:
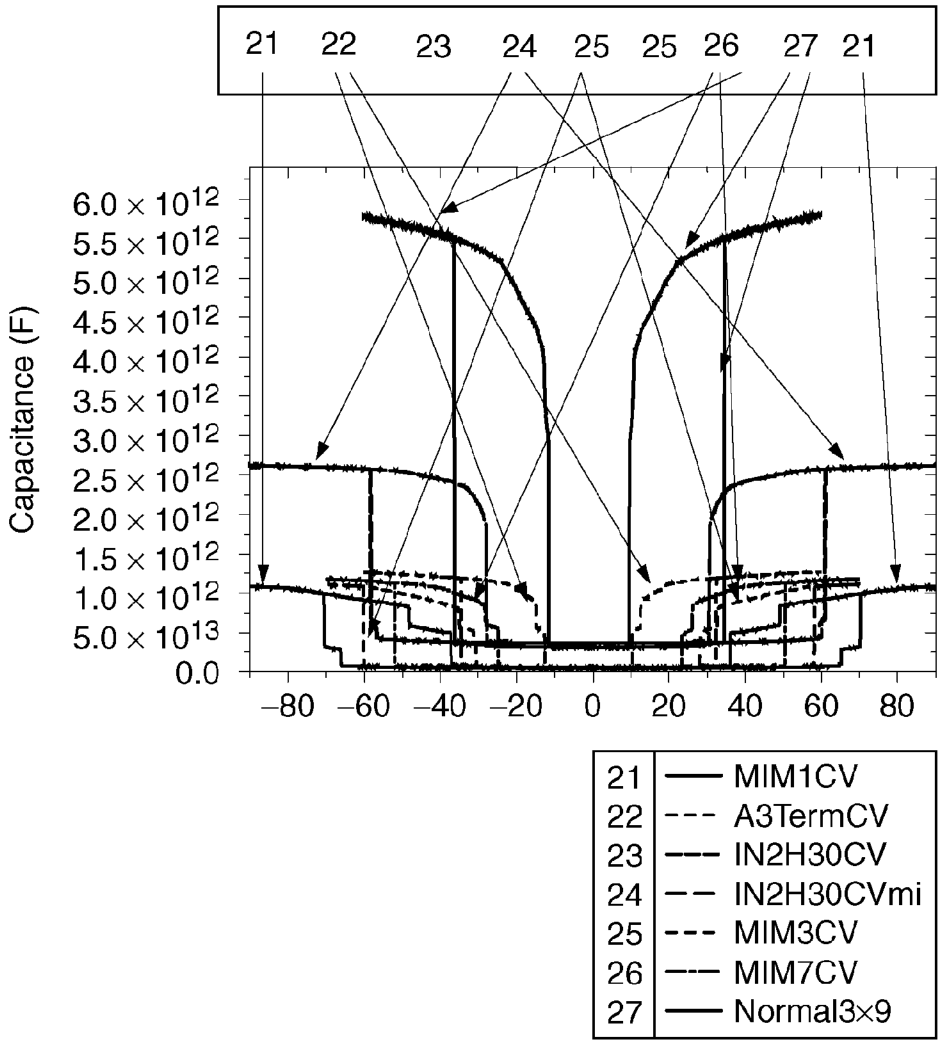
FIG. 4 shows capacitance voltage curves of several MEMS devices including devices according to the present invention, e.g. measurements on conventional devices and measurements on the device in FIG. 2.

FIG. 4 shows capacitance voltage curves of several MEMS devices including devices according to the present invention, e.g. measurements on conventional devices and measurements of the device in FIG. 2. Note especially that the ratio of Vpi/Vre has reduced from a factor ~4 for the conventional device to a factor 2 for devices in accordance with the present invention. This corresponds with the fact that the dielectric thickness is doubled. Note on the other hand that the ratio $C_{on}/C_{off}$ has also reduced, this was not expected and is attributed to undesired parasitics. In FIG. 4 measurements of a switch according to an embodiment of the present invention are shown in the lines 23. The lines 27 are measurements from a conventional switch with the same membrane and springs. Since the dielectric thickness is doubled, the ratio $V_{pi}/V_{re}$ of the invented switch is indeed reduced by a factor 2 from about 4 to 2. At the same time the ratio $C_{on}/C_{off}$ reduced, in fact $C_{off}$ is even larger than for the conventional design.

The present invention finds applications in, for example,

RF circuits

RF circuits for mobile communication devices

Reconfigurable RF filters or impedance matching networks

Voltage controlled oscillators

Reconfigurable antenna's.

Adaptive antenna matching networks.

The invention claimed is:

1. A capacitive MEMS device comprising: a first electrode lying in a plane, a second electrode suspended above the first electrode and movable with respect to the first electrode, a gap being present between the first electrode and the second electrode, a third electrode placed intermediate the first and second electrode with the gap between the third electrode and the second electrode, wherein the third electrode has a plurality of first holes therein.

2. The MEMS device of claim 1, wherein the first electrode is an actuation electrode.

3. The MEMS device according to claim 1, wherein the first holes are arranged in an irregular or regular array.

4. The MEMS device of claim 1, wherein one or more of the first to third electrodes are made of metal.

5. The MEMS device of claim 1, wherein the third electrode comprises a first dielectric layer and a second dielectric layer, thus forming a stack, wherein the first dielectric layer is located between the first electrode and the third electrode, and the third electrode is covered by the second dielectric layer facing the bottom of the second electrode.

6. The MEMS device of claim 1, further comprising a voltage source for applying a DC potential to one or more of the first electrode and the second electrode.

7. The MEMS device of claim 1, wherein a source of an RF voltage is applied to the second electrode.

8. The MEMS device of claim 1, wherein the first electrode has a plurality of holes therein.

9. The MEMS device of claim 1, wherein the second electrode has a plurality of holes therein.

10. The MEMS device of claim 1, wherein the first electrode has a first area, the second electrode has a second area and the third electrode has a third area, the first, second and third areas extending in a direction substantially parallel to the plane of the first electrode.

11. The MEMS device of claim 10, wherein the first, second and third areas are substantially the same in size.

12. The MEMS device of claim 1, wherein the ratio $V_{pi}/V_{re}$ is in the range of 1 to 50, wherein the variable $V_{pi}$ is the pull in voltage of the MEMS device, and the variable $V_{re}$ is the release voltage of the MEMS device.

13. The MEMS device of claim 1, wherein the device is a switch.

14. The MEMS device of claim 13, wherein the switch is formed such that $(t1+t2)/\epsilon_r>2g/3$, and then $V_{pi}=V_{re}$ and the capacitance of the switch is continuously tunable, where t2 is a thickness of a second dielectric layer comprising a portion of the third electrode and facing the second electrode, t1 is a thickness of a first dielectric layer comprising a portion of the third electrode and located between the first and third electrode, $\epsilon_r$, the relative dielectric constant, and g the gap.

15. An application selected from the group conisisting of an RF circuit, a RF circuit for mobile communication devices, a reconfigurable RF filters, an impedance matching network, a voltage controlled oscillator, a reconfigurable antenna, and an adaptive antenna matching network, comprising an MEMS device of claim 1.

* * * * *